(12) United States Patent
Takahashi

(10) Patent No.: US 8,963,198 B2
(45) Date of Patent: Feb. 24, 2015

(54) SEMICONDUCTOR DEVICE

(75) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 99 days.

(21) Appl. No.: 13/614,503

(22) Filed: Sep. 13, 2012

(65) Prior Publication Data

US 2013/0153954 A1 Jun. 20, 2013

(30) Foreign Application Priority Data

Dec. 16, 2011 (JP) ................................. 2011-275475

(51) Int. Cl.
 *H01L 29/739* (2006.01)
(52) U.S. Cl.
 USPC ........................................................ 257/139
(58) Field of Classification Search
 USPC ........... 257/139, 487–496, E29.007, E29.197
 See application file for complete search history.

(56) References Cited

U.S. PATENT DOCUMENTS

| 4,602,266 A | 7/1986 | Coe | |
|---|---|---|---|
| 5,723,882 A * | 3/1998 | Okabe et al. | 257/139 |
| 2010/0252904 A1* | 10/2010 | Takahashi et al. | 257/492 |

FOREIGN PATENT DOCUMENTS

| JP | S59-141267 A | 8/1984 | |
|---|---|---|---|
| JP | 06-021358 A | 1/1994 | |
| JP | H11-068085 A | 3/1999 | |
| JP | 2000-150859 A | 5/2000 | |
| JP | 2004-158817 * | 3/2004 | ............ H01L 29/78 |
| JP | 2004-158817 A | 6/2004 | |
| JP | 2009-164489 A | 7/2009 | |

OTHER PUBLICATIONS

Y.Tomomatsu et al.; "An analysis and improvement of destruction immunity during reverse recovery for high voltage planar diodes under high dIrr/dt condition"; International Symposium on Power Semiconductor Devices and IC's (ISPDS),; pp. 353; 1996.

An Office Action; "Notice of Grounds of Rejection," issued by the Japanese Patent Office on Nov. 18, 2014, which corresponds to Japanese Patent Application No. 2011-275475 and is related to U.S. Appl. No. 13/614,503; with English language translation.

* cited by examiner

*Primary Examiner* — Fernando L Toledo
*Assistant Examiner* — Lawrence-Linh T Nguyen
(74) *Attorney, Agent, or Firm* — Studebaker & Brackett PC

(57) ABSTRACT

In one surface of a semiconductor substrate, an $n^-$ layer, a p base layer, a p well layer, another p well layer, a channel stopper layer, an emitter electrode, a guard ring electrode, and a channel stopper electrode for example are formed. In the other surface of the semiconductor substrate, an $n^+$ buffer layer, a $p^+$ collector layer, and a collector electrode are formed. In a curved corner of the p well layer, a p low-concentration layer having a lower impurity concentration than the impurity concentration of the p well layer is formed from the surface to a predetermined depth.

7 Claims, 14 Drawing Sheets

SEMICONDUCTOR DEVICE

BACKGROUND OF THE INVENTION

1. Field of the Invention

The present invention relates to a semiconductor device and particularly to a semiconductor device for power applications.

2. Description of the Background Art

In general, a high-breakdown-voltage power device is required to block current and keep a high voltage when turned OFF and conduct current with a lowest possible loss when turned ON (ON operation), and further desired to switch between ON and OFF with a lowest possible switching loss.

When the high-breakdown-voltage power device switches from ON to OFF, it is indispensable for this power device to block current without leading to breakdown. The IGBT (Insulated Gate Bipolar Transistor) which is a typical high-breakdown-voltage power device has properties including a reverse biased safe operating area (RBSOA) representing a current-voltage area in which current can be blocked in safety in terms of the fact that the high-breakdown-voltage power device does not lead to breakdown.

Factors that cause the reverse biased safe operating area of the IGBT to narrow may include an increased electric field (generation of a high electric field) and current concentration at the boundary between a device-formed region in which devices such as transistor cell are provided and a breakdown-voltage-holding region including a guard ring or the like. Regarding inductive load switching for example, a high-voltage and large-current state occurs in a turn-off process and, depending on blocking conditions, electron-hole pairs are generated due to impact ionization. If they are generated locally, the temperature increases to cause breakdown in some cases. Especially when there is a large amount of a hole current component, the influence of positive space charge causes the electric field to be strengthened and therefore impact ionization is more likely to occur.

In the case of the IGBT, when holes flow from the collector to the emitter in the ON state, the holes partially stay in a region outside the device-formed region and thus hole current components are present in this region. Therefore, in the turn-off process from the ON state to the OFF state, the electric field is further strengthened in the corners of the device-formed region, which causes local impact ionization and may result in breakdown.

Schemes for preventing breakdown at such corners of the device-formed region are disclosed in the documents: Japanese Patent Laying-Open Nos. 06-21358, 2004-158817, and 2000-150859 as well as International Symposium on Power Semiconductor Devices and IC's (ISPSD), p. 353, 1996.

SUMMARY OF THE INVENTION

Conventional semiconductor devices, however, have the following problems. Namely, it is necessary for example to additionally implant a predetermined impurity that shortens the lifetime or additionally form a groove for increasing the resistance of a current path, possibly resulting in an increased production cost.

The present invention has been made to solve the problems above and an object of the invention is to provide a semiconductor device whose breakdown is effectively prevented without increasing the production cost.

The semiconductor device according to the present invention is a semiconductor device conducting current between a first electrode formed on one surface of a semiconductor substrate and a second electrode formed on the other surface of the semiconductor substrate. The semiconductor device includes: the semiconductor substrate; a first region of a first conductivity type; a second region of a second conductivity type having a predetermined impurity concentration; a third region of the second conductivity type; the first electrode; and the second electrode. The semiconductor substrate has a first main surface and a second main surface opposite to each other. The first region of the first conductivity type is formed in the first main surface of the semiconductor substrate to extend from the first main surface to a first depth. The second region of the second conductivity type having a predetermined impurity concentration has a planar pattern including a corner, and is formed from a surface of a predetermined region in the first region to a second depth shallower than the first depth. The third region of the second conductivity type circumferentially surrounds the second region so that the third region is spaced from the second region, and formed from a surface of the first region to a third depth. The first electrode is formed to be electrically connected to the second region. The second electrode is formed to contact the second main surface of the semiconductor substrate. In the corner of the second region, a low-impurity-concentration region having an effective impurity concentration lower than the predetermined impurity concentration is formed.

Regarding the semiconductor device according to the present invention, breakdown of the semiconductor device due to local impact ionization can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

An IGBT will be illustrated here as an example of the semiconductor device according to a first embodiment of the present invention, and a description will be given of a first example of the IGBT.

Figure 1:
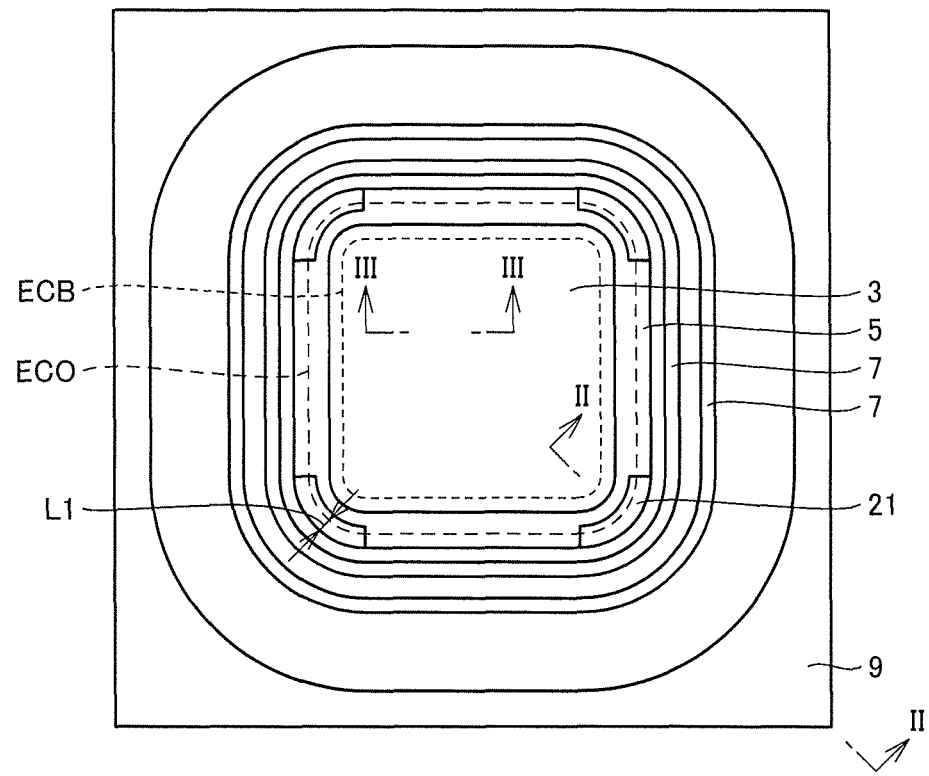
FIG. 1 is a plan view of a semiconductor device according to a first embodiment of the present invention.
Figure 2:
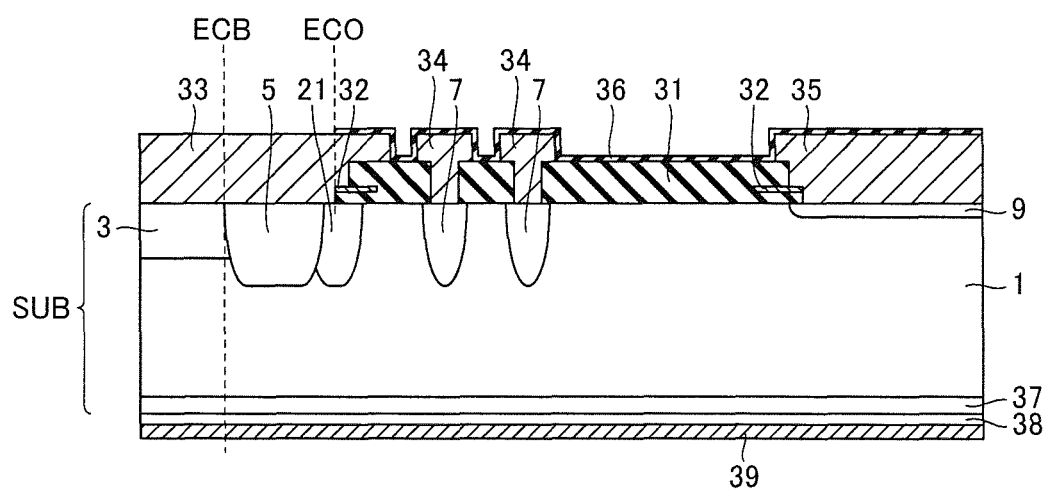
FIG. 2 is a cross section along a cross section line II-II shown in FIG. 1 in the first embodiment.
Figure 3:
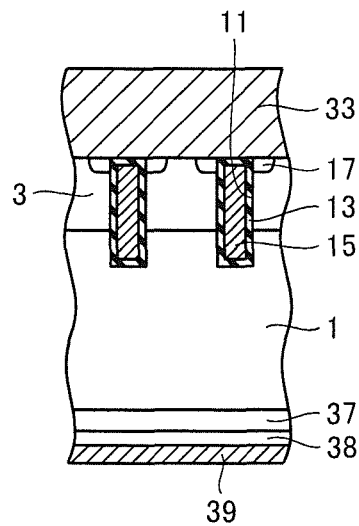
FIG. 3 is a cross section along a cross section line III-III shown in FIG. 1 in the first embodiment.

FIG. 1 is a plan view of the semiconductor device according to the first embodiment of the present invention, FIG. 2 is a cross section along a cross section line II-II shown in FIG. 1, and FIG. 3 is a cross section along a cross section line shown in FIG. 1. In the plan view of FIG. 1, components located on a semiconductor substrate that are depicted in the cross section of FIG. 2 are not shown for the sake of convenience. To be accurate, FIG. 1 illustrates a pattern (prior to heat treatment, corresponding to a mask pattern) for forming each impurity layer to be formed in the semiconductor substrate. The same is applied as well to the plan views referenced hereinafter.

As shown in FIGS. 1 and 2, an n⁻ layer 1 is formed from one surface (first main surface) of a semiconductor substrate SUB to a predetermined depth. In a predetermined region of this n⁻ layer 1, a p base layer 3 (impurity concentration: on the order of about $1 \times 10^{17}/cm^3$ to $1 \times 10^{18}/cm^3$) in a substantially rectangular shape is formed as a planar pattern from the surface to a predetermined depth. In p base layer 3, a MOS (Metal Oxide Semiconductor) structure in the IGBT is formed as described later herein, and it serves as a region where a channel is generated. A p well layer 5 (impurity concentration: on the order of about $1 \times 10^{18}/cm^3$ to $1 \times 10^{19}/cm^3$) is formed from the surface to a predetermined depth so that it surrounds the outer perimeter of p base layer 3. The impurity concentration of p well layer 5 is set higher than the impurity concentration of p base layer 3. P well layer 5 is formed to a depth greater than or substantially equal to the depth of p base layer 3. P well layer 5 serves to alleviate the electric field intensity of an outer peripheral portion in p base layer 3. P well layer 5 thus surrounds p base layer 3 and accordingly the (outer) contour of p well layer 5 is a planar pattern having corners. It should be noted that "corner" herein refers to a shape as seen in a plan view (a part of the planar pattern) unless otherwise defined in the following description.

At a distance from p well layer 5, a p well layer 7 functioning as a guard ring is formed from the surface to a predetermined depth so that the p well layer surrounds the outer perimeter of p well layer 5. Regarding p well layers 7 serving as guard rings, the number of p well layers 7 and the interval therebetween for example are selected as appropriate depending on the breakdown voltage of the semiconductor device. For this semiconductor device, an example is illustrated where two p well layers 7 are formed. Moreover, in a region between p well layer 7 and the end of the chip (semiconductor device), an n-type channel stopper layer 9 is formed from the surface to a predetermined depth so that the channel stopper layer is spaced from p well layer 7 and surrounds the outer perimeter of p well layer 7.

An interlayer insulating film 31 formed of a silicon oxide film or the like is formed to cover the one surface of semiconductor substrate SUB in such a manner that exposes at least a part of p base layer 3, p well layer 5, p well layer 7, and channel stopper layer 9 each, namely to cover the one surface of the semiconductor substrate except for contact regions. In interlayer insulating film 31, field plates 32 are formed on the side where p well layer 5 is located and on the side where channel stopper layer 9 is located, respectively. On interlayer insulating film 31, a desired electrode or interconnect formed of a patterned metal film is formed. Specifically, an emitter electrode 33 is formed to contact p base layer 3 and p well layer 5. Emitter electrode 33 is formed within an emitter contact boundary ECO.

A guard ring electrode 34 is further formed to contact p well layer 7. Moreover, a channel stopper electrode 35 is formed to contact channel stopper layer 9. Field plate 32 in interlayer insulating film 31 is formed for example of a polycrystalline silicon film. Field plate 32 formed on the side where p well layer 5 is located is electrically connected to emitter electrode 33. Field plate 32 formed on the side where channel stopper layer 9 is located is electrically connected to channel stopper electrode 35. A passivation film 36 formed of a silicon nitride film or the like is formed to cover components including channel stopper electrode 35, interlayer insulating film 31, and guard ring electrode 34.

From the other surface (second main surface) of semiconductor substrate SUB to a predetermined depth, a p⁺ collector layer 38 is formed. Moreover, from p⁺ collector layer 38 to n⁻ layer 1, an n⁺ buffer layer 37 is formed. A collector electrode 39 formed of a metal film is formed to contact p⁺ collector layer 38.

In the one surface of semiconductor substrate SUB, a trench 11 is formed as shown in FIG. 3 from the surface into n⁻ layer 1, within a transistor cell region boundary ECB of the region where p base layer 3 is formed. In trench 11, an embedded gate electrode 15 formed of a polycrystalline silicon film for example is formed with a gate insulating film 13 interposed on the sidewall of trench 11. To a predetermined depth from the surface of semiconductor substrate SUB, an n⁺ emitter layer 17 is formed along the side surface of trench 11.

In this semiconductor device, the corners of p well layer 5 are of a curved shape. In this corner, a p low-concentration layer (p⁻ layer) 21 (impurity concentration: on the order of about $1 \times 10^{15}/cm^3$ to $1 \times 10^{18}/cm^3$) having a lower impurity concentration than the impurity concentration of p well layer 5 is formed from the surface to a predetermined depth. P low-concentration layer 21 is electrically connected in such a manner that layer 21 contacts emitter electrode 33, together with p well layer 5.

A description will now be given of a method of manufacturing a main part of the semiconductor device including p low-concentration layer 21. P low-concentration layer 21 or the like is formed by photolithography and impurity implantation. A predetermined photolithography process is used to form a resist pattern on semiconductor substrate SUB that exposes a predetermined region where p low-concentration layer 21 is to be formed. Then, this resist pattern is used as a mask to implant a p-type impurity with a predetermined impurity concentration (impurity concentration A) in the exposed region of semiconductor substrate SUB. Then, a predetermined heat treatment is performed to diffuse the implanted p-type impurity to thereby form p low-concentration layer 21.

Subsequently, p well layer 5 and p well layer 7 are formed in the same manner. A resist pattern formed by a predetermined photolithography process is used as a mask to implant a p-type impurity at a higher impurity concentration than impurity concentration A. After this, a predetermined heat treatment is performed to diffuse the p-type impurity to thereby form p well layer 5 and p well layer 7. After this, the semiconductor device is formed through the same process as the conventional process of forming a semiconductor device.

An operation of the above-described semiconductor device will now be described. A description will be given first of an ON operation (state). To embedded gate electrode 15 formed in a region of p base layer 3, a predetermined (positive) voltage equal to or higher than a threshold voltage is applied to thereby form an N channel in a portion of p base layer 3 that is located in the vicinity of embedded gate electrode 15, and the MOS channel is rendered ON. The MOS channel is thus rendered ON to cause electrons to be injected from $n^+$ emitter layer 17 through the N channel into $n^-$ layer 1. Meanwhile, holes are injected from $p^+$ collector layer 38 into $n^-$ layer 1. Thus, the electrons and holes are injected into $n^-$ layer 1 to cause conductivity modulation and lower the voltage between collector electrode 39 and emitter electrode 33, and accordingly the ON state is reached.

A description will be given next of a turn-off operation. The voltage applied to embedded gate electrode 15 is set lower than the threshold voltage to thereby extinguish the N channel and render the MOS channel OFF. The MOS channel is thus rendered OFF to stop injection of electrons and holes into $n^-$ layer 1. After this, the holes stored in $n^-$ layer 1 are removed from p base layer 3 to emitter electrode 33. Meanwhile, the electrons are removed to collector electrode 39. At the time when a depletion region that is left after the holes and electrons are removed becomes able to hold the breakdown voltage, the OFF state is reached.

In the above-described semiconductor device, p low-concentration layer 21 having a relatively lower impurity concentration is formed in the corner of p well layer 5 and accordingly, impact ionization due to holes in the turn-off operation can be reduced without increasing the cost. This will be described using a comparative example.

Figure 4:
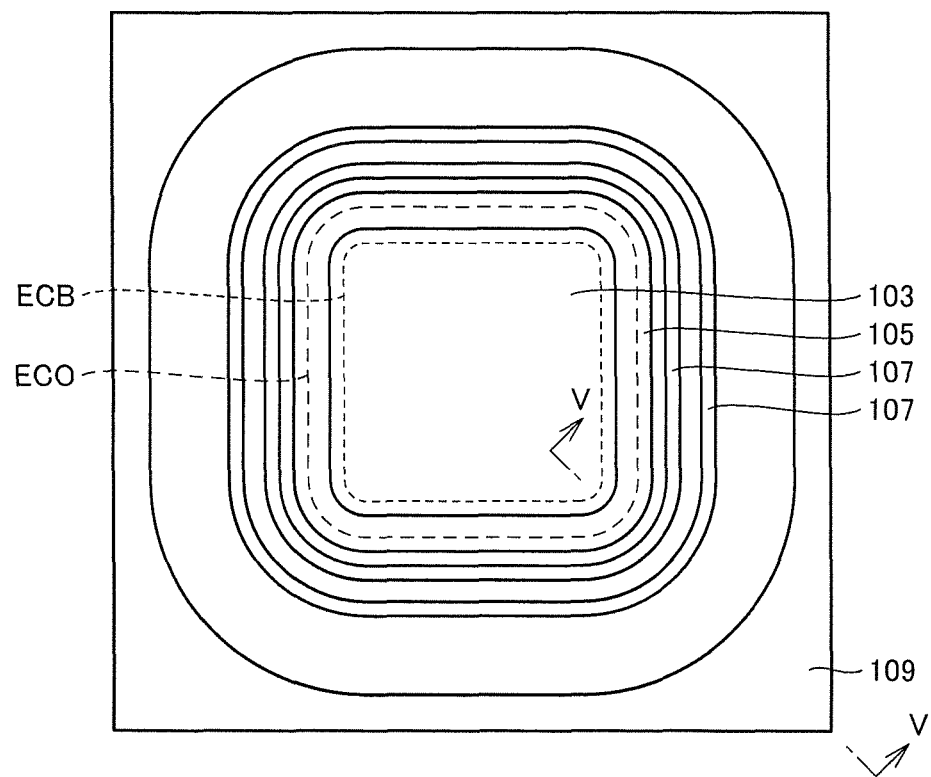
FIG. 4 is a plan view of a semiconductor device according to a first comparative example.
Figure 5:
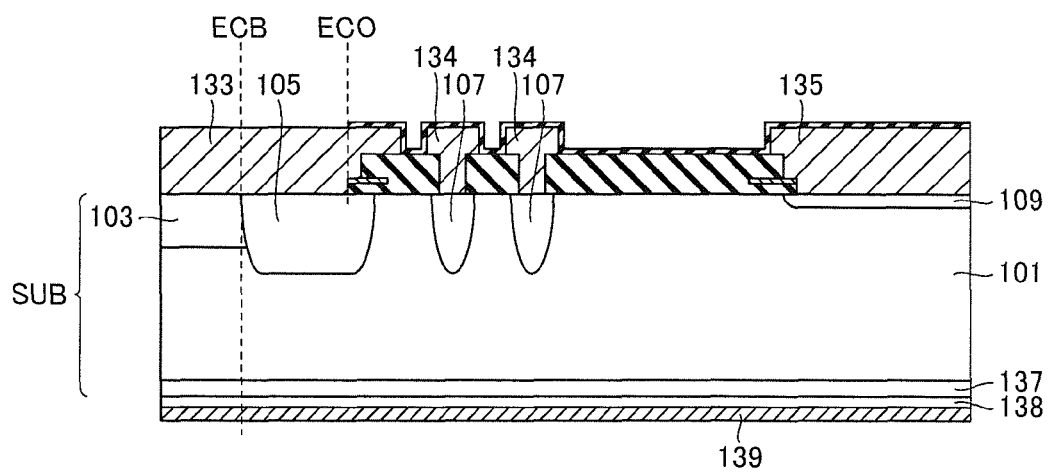
FIG. 5 is a cross section along a cross section line V-V shown in FIG. 4.

A semiconductor device according to a first comparative example is identical to the semiconductor device of the present embodiment in terms of the structure except that the p low-concentration layer is not formed in the former semiconductor device. FIG. 4 is a plan view of the semiconductor device according to the first comparative example, and FIG. 5 is a cross section along a cross section line V-V shown in FIG. 4. As shown in FIGS. 4 and 5, in one surface of semiconductor substrate SUB, an $n^-$ layer 101, a p base layer 103, a p well layer 105, a p well layer 107, a channel stopper layer 109, an emitter electrode 133, a guard ring electrode 134, and a channel stopper electrode 135, for example, are formed. In the other surface of semiconductor substrate SUB, an $n^+$ buffer layer 137, a $p^+$ collector layer 138 and a collector electrode 139 are formed.

Figure 6:
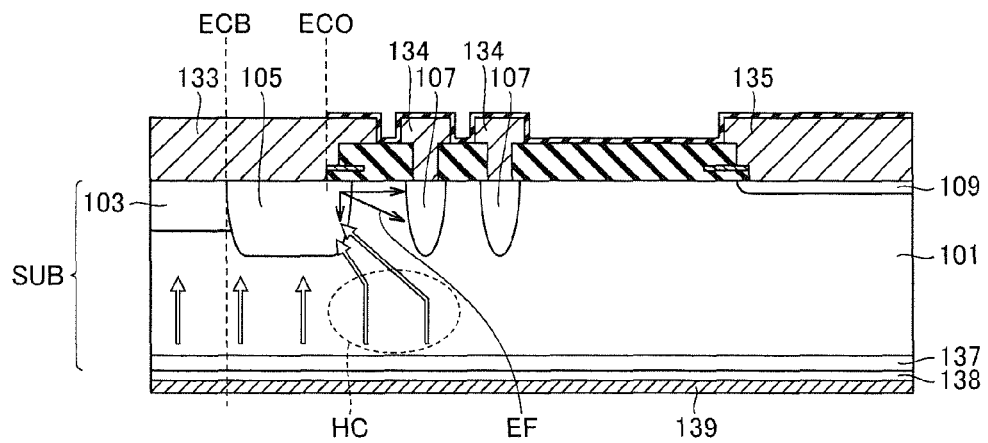
FIG. 6 is a cross section for illustrating hole current in the semiconductor device according to the first comparative example.

An operation will now be described. First, in an ON operation, a predetermined (positive) voltage equal to or higher than a threshold voltage is applied to an embedded gate electrode (not shown) formed in a region of p base layer 103 to thereby render the MOS channel ON, cause electrons and holes to be injected into $n^-$ layer 101 and accordingly cause conductivity modulation, and cause the voltage between collector electrode 139 and emitter electrode 133 to decrease. At this time, as shown in FIG. 6, there is a hole current component (hole current HC) injected from a portion of the $p^+$ collector layer opposite to an outer peripheral region located outside p base layer 103 into an outer peripheral portion in p base layer 103. This hole current HC depends on the width of the outer peripheral region, the thickness of semiconductor substrate SUB, and the collector injection efficiency, for example.

Then, in a turn-off operation, the voltage applied to the embedded gate electrode is set lower than the threshold voltage to thereby render the MOS channel OFF. The MOS channel is thus rendered OFF to stop injection of electrons and holes into $n^-$ layer 101. After this, the holes stored in $n^-$ layer 101 are removed from p base layer 103 to emitter electrode 133. Meanwhile, the electrons are removed to collector electrode 139. At the time when a depletion region that is left after the holes and electrons are removed becomes able to hold the breakdown voltage, the OFF state is reached.

Regarding inductive load switching for example, a high-voltage and large-current state occurs in a turn-off process and, depending on blocking conditions, electron-hole pairs are generated due to impact ionization. If they are generated locally, the temperature increases to cause breakdown in some cases. Especially when there is a large amount of the hole current component, the influence of positive space charge causes the electric field to be strengthened and therefore impact ionization is more likely to occur.

Here, a description will be given of occurrence of impact ionization in the first comparative example. FIG. 6 is a cross section for illustrating hole current in the semiconductor device according to the first comparative example. As shown in FIG. 6, in the semiconductor device of the first comparative example, there is a hole current component (hole current HC) generated by holes stored in the outer peripheral region located outside p base layer 103. Here, as indicated by the vectors in FIG. 6, the lateral (parallel to the surface of the semiconductor substrate) electric field and the vertical electric field are applied in both cases of the static characteristic and the dynamic characteristic, in the outer peripheral portion in p well layer 105 (p base layer 103) and therefore electric field EF is strengthened. If holes function as positive space charge, the electric field is still further strengthened even under the same voltage condition. This will be described with reference to FIG. 7.

Figure 7:
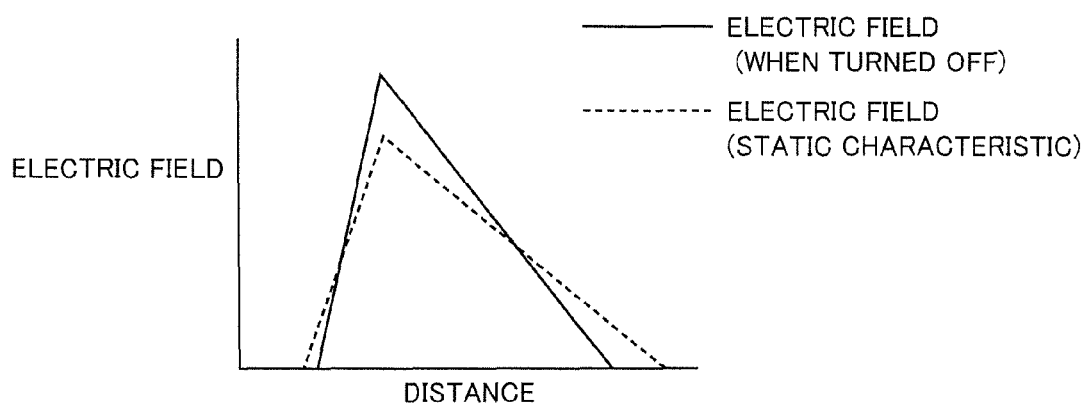
FIG. 7 is a graph showing electric field profiles in the depth direction.

FIG. 7 shows an electric field profile of the static characteristic (when DC potential is applied) and an electric field profile at the time of turn off (switching). The voltage is determined by integrating the electric field and corresponds to the area of the triangle shown in FIG. 7. As shown in FIG. 7, while the triangle's area (voltage) at the time of turn off and that of the static characteristic are identical, the base of the triangle at the time of turn off is shorter since flowing holes serve as space charge to suppress expansion of the depletion layer. Accordingly, under the same voltage condition, the electric field peak at the time of turn off is higher. Especially the corner of p well layer 105 is a portion where the electric field is strongest in terms of the two dimensional respect, in which local impact ionization occurs, possibly leading to breakdown.

Figure 8:
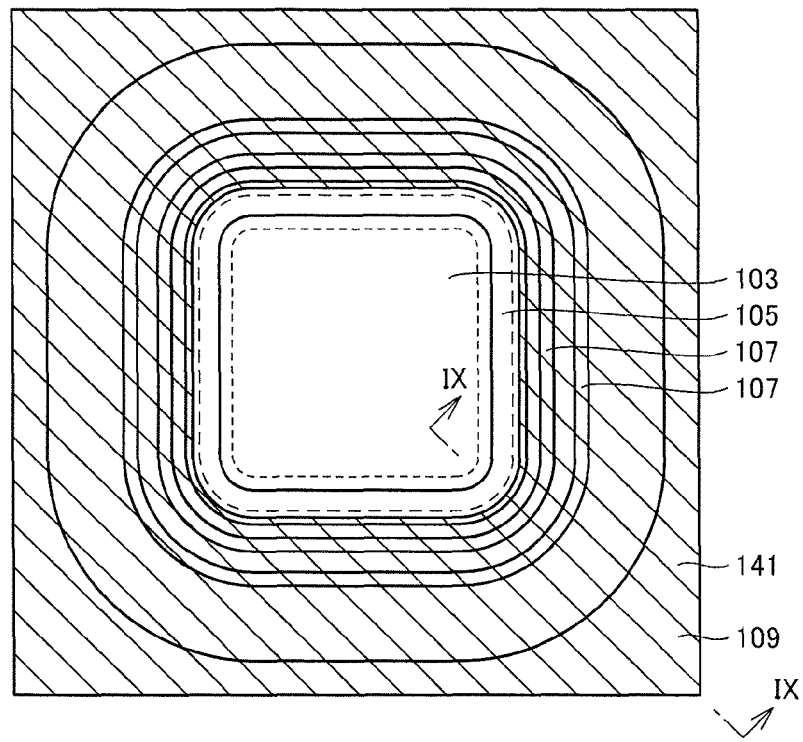
FIG. 8 is a plan view of a semiconductor device according to a second comparative example.
Figure 9:
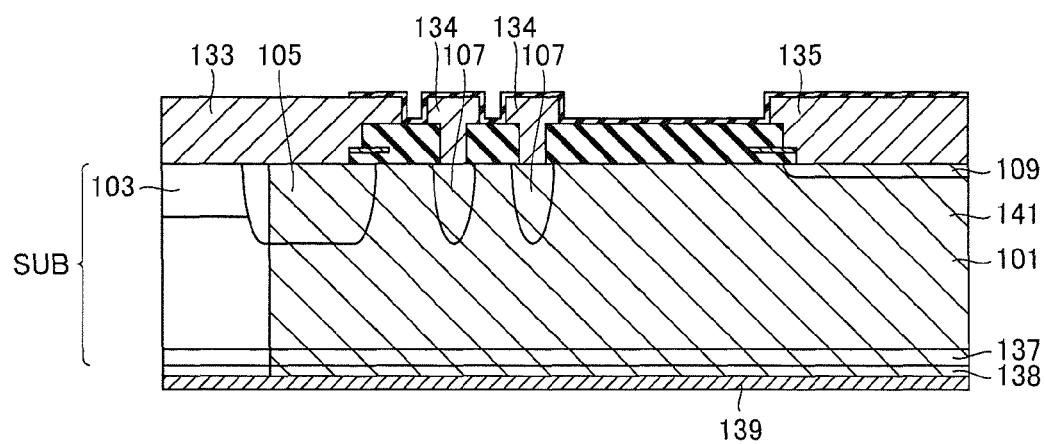
FIG. 9 is a cross section along a cross section line IX-IX shown in FIG. 8.

A semiconductor device according to a second comparative example (PTL 1) that reduces such impact ionization will be described. FIG. 8 is a plan view of the semiconductor device according to the second comparative example, and FIG. 9 is a cross section along a cross section line IX-IX shown in FIG. 8. As shown in FIGS. 8 and 9, in the semiconductor device of the second comparative example, a low lifetime region 141 is formed in a region located outside p base layer 103. Since features other than this are similar to those of the semiconductor device of the first comparative example, the same components are denoted by the same reference characters.

Low lifetime region 141 is formed by applying an electron beam or the like to intentionally cause a crystal defect in a specific region in $n^-$ layer 101. The crystal defect is utilized to reduce occurrences of the conductivity modulation and reduce holes stored in the outer peripheral region located outside p base layer 103. Accordingly, breakdown in the corners of p base layer 103 (p well layer 105) can be prevented. Regarding the semiconductor device according to the second comparative example, however, an additional process of applying an electron beam or the like to a specific region is necessary. Moreover, a special manufacturing apparatus different from the commonly used semiconductor manufacturing apparatus is necessary for applying the electron beam or the like, resulting in an increase in production cost.

Japanese Patent Laying-Open No. 2004-158817 proposes a structure in which an additional impurity region is formed outside each guard ring corner to thereby alleviate the electric field. While this structure can contribute to electric field alleviation, current concentration in the corner determined by carrier distribution in the ON state still occurs, and therefore, the structure cannot sufficiently alleviate current concentration in the corners at the time of turn off. Moreover, the additional impurity region formed outside the guard ring hinders reduction of the occupied area.

Japanese Patent Laying-Open No. 2000-150859 proposes a structure in which a trench is formed at an end of an anode of a diode or an impurity different from the anode is counter-implanted into the anode to thereby control the resistance in the corner. While this structure provides an effect that current in the corner determined by carrier distribution does not concentrate in the corner, the process of forming a trench must be added, resulting in an increase of the production cost. Furthermore, because of lack of means for alleviating the electric field in the corner, local impact ionization is likely to occur at the time of turn off.

Figure 10:
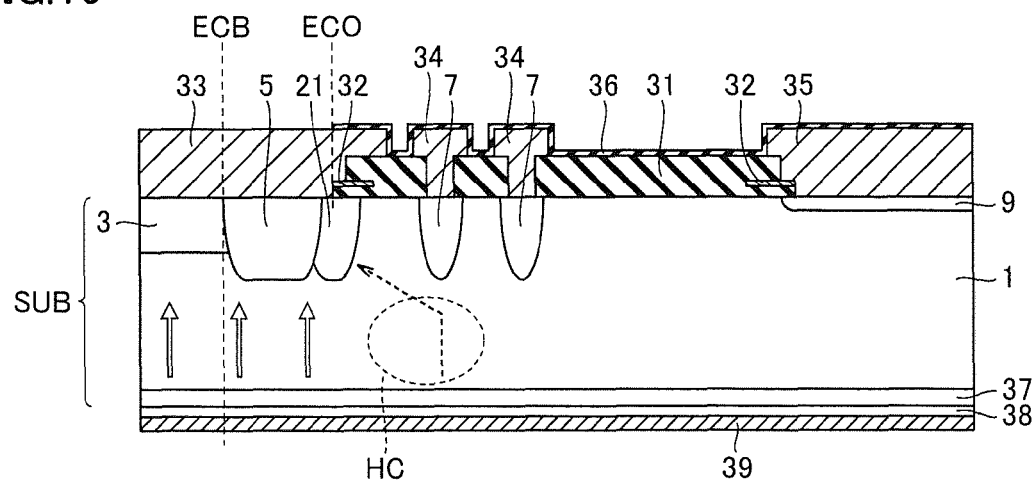
FIG. 10 is a cross section for illustrating hole current in the first embodiment.

In contrast to the semiconductor device for example according to the first or second comparative example, the semiconductor device of the present embodiment has p low-concentration layer 21 having a relatively lower impurity concentration and formed in a corner of p well layer 5. Therefore, in the corner of p well layer 5, the resistance in the region from the outer peripheral end to the portion where the IGBT is formed (emitter contact boundary ECO) (length L1) is high. Thus, as shown in the cross section of FIG. 10 for illustrating hole current of the semiconductor device according to the present embodiment, hole current HC flowing into the corner at the time of turn off is less than the hole current flowing in a region other than the corners, and impact ionization in the corners is reduced.

Consequently, local impact ionization in the corners is suppressed and breakdown of the semiconductor device can be prevented. Moreover, this can be achieved by merely forming p low-concentration layer 21 in the region corresponding to the corner of p well layer 5 without the need to expand the area to be occupied by the semiconductor device and the need to separately form an additional region. In this way, breakdown of the semiconductor device can be prevented without increasing the production cost.

Second Embodiment

Figure 11:
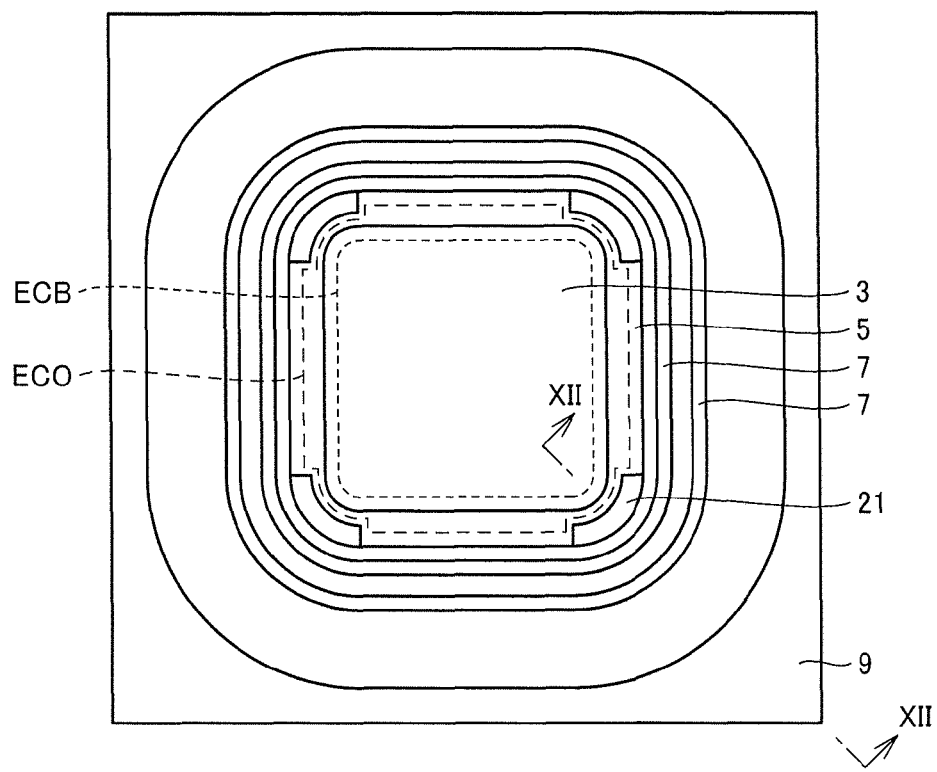
FIG. 11 is a plan view of a semiconductor device according to a second embodiment of the present invention.
Figure 12:
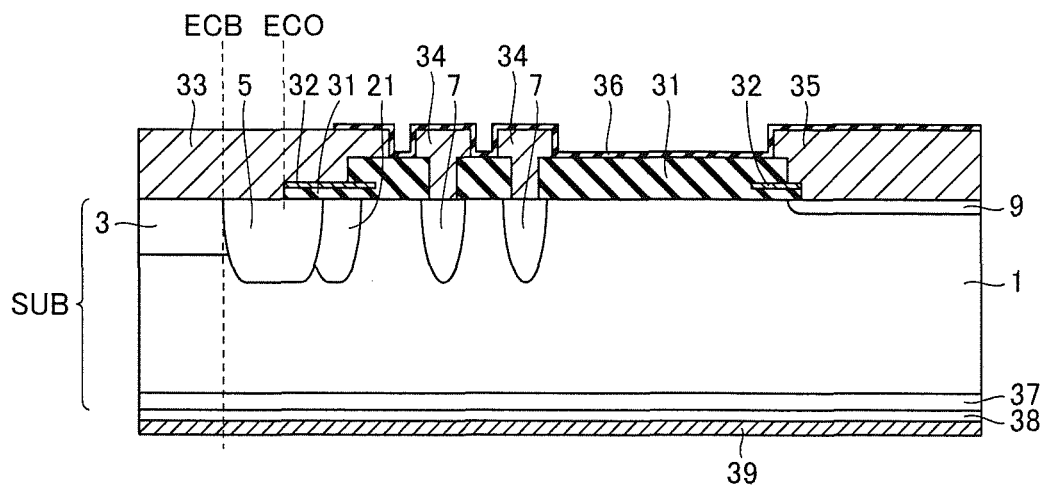
FIG. 12 is a cross section along a cross section line XII-XII shown in FIG. 11 in the second embodiment.

Here, a second example of the IGBT will be described. FIG. 11 is a plan view of a semiconductor device according to a second embodiment of the present invention, and FIG. 12 is a cross section along a cross section line XII-XII shown in FIG. 11. As shown in FIGS. 11 and 12, a p low-concentration layer 21 having a relatively lower impurity concentration is formed in a corner region of p well layer 5. Emitter electrode 33 does not contact p low-concentration layer 21, and an interlayer insulating film 31 is interposed between emitter electrode 33 and p low-concentration layer 21. Since features other than the above-described ones are similar to those shown in FIGS. 1 and 2, the same components are denoted by the same reference characters and the description thereof will not be repeated.

An operation of the semiconductor device will now be described. The operation of this semiconductor device is basically identical to the operation of the semiconductor device described in connection with the first embodiment. In an ON operation, a predetermined (positive) voltage equal to or higher than a threshold voltage is applied to an embedded gate electrode (not shown) formed in a region of p base layer 3 to thereby render the MOS channel ON, cause electrons and holes to be injected into $n^-$ layer 1 and accordingly cause conductivity modulation, and cause the voltage between collector electrode 39 and emitter electrode 33 to decrease.

In a turn-off operation, the voltage applied to the embedded gate electrode is set lower than the threshold voltage to thereby render the MOS channel OFF. The MOS channel is thus rendered OFF to stop injection of electrons and holes. After this, the holes stored in $n^-$ layer 1 are removed from p base layer 3 to emitter electrode 33. Meanwhile, the electrons are removed to collector electrode 39. At the time when a depletion region that is left after the holes and electrons are removed becomes able to hold the breakdown voltage, the OFF state is reached.

In the above-described semiconductor device, as shown in FIG. 12, p low-concentration layer 21 with a relatively low impurity concentration formed in a corner of p well layer 5 does not directly contact emitter electrode 33, and interlayer insulating film 31 is interposed between emitter electrode 33 and p low-concentration layer 21. Accordingly, the resistance of the portion from p low-concentration layer 21 to the region of p base layer 3 in which components including the embedded electrode are substantially formed (to transistor cell region boundary ECB) can be made higher than that of the semiconductor device according to the first embodiment. Therefore, in the turn-off operation, current in the corner of p well layer 5 is dispersed, hole current flowing into p low-concentration layer 21 decreases, and the electric field is alleviated. As a result, local impact ionization in the corner is suppressed and breakdown of the semiconductor device can be prevented.

Moreover, this is achieved by merely forming p low-concentration layer 21 in a region corresponding to the corner of p well layer 5 and patterning the interlayer insulating film so that it covers the p low-concentration layer, without the need to expand the area to be occupied by the semiconductor device and the need to separately form an additional region.

Thus, breakdown of the semiconductor device can be prevented without increasing the production cost.

Third Embodiment

Figure 13:
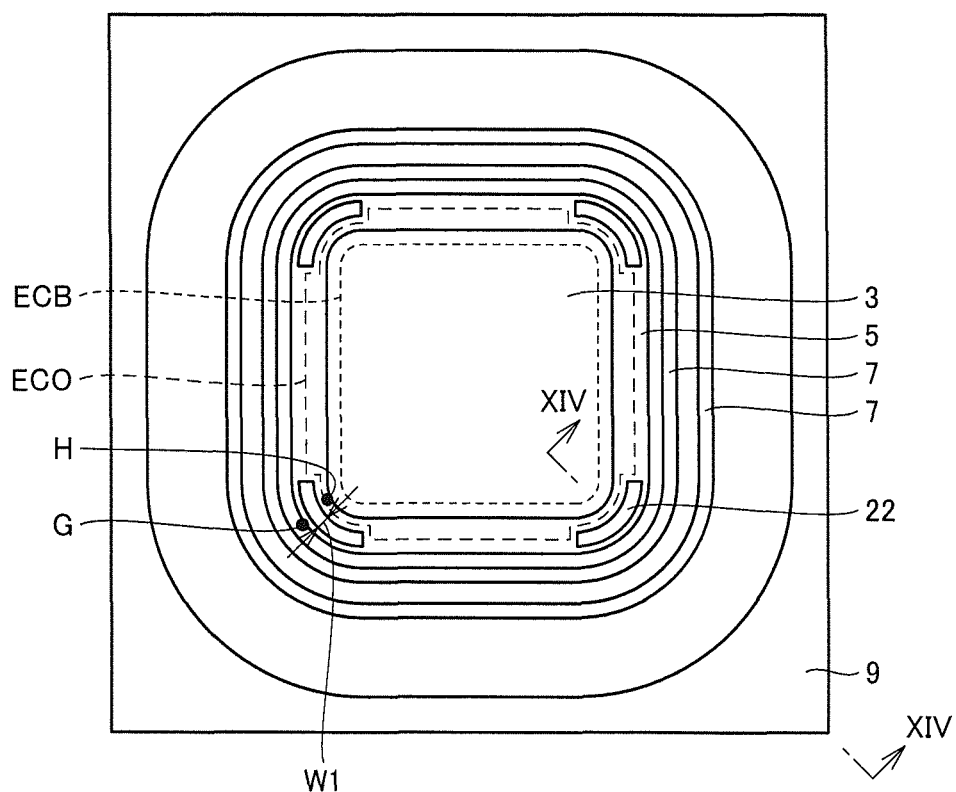
FIG. 13 is a plan view of a semiconductor device according to a third embodiment of the present invention.
Figure 14:
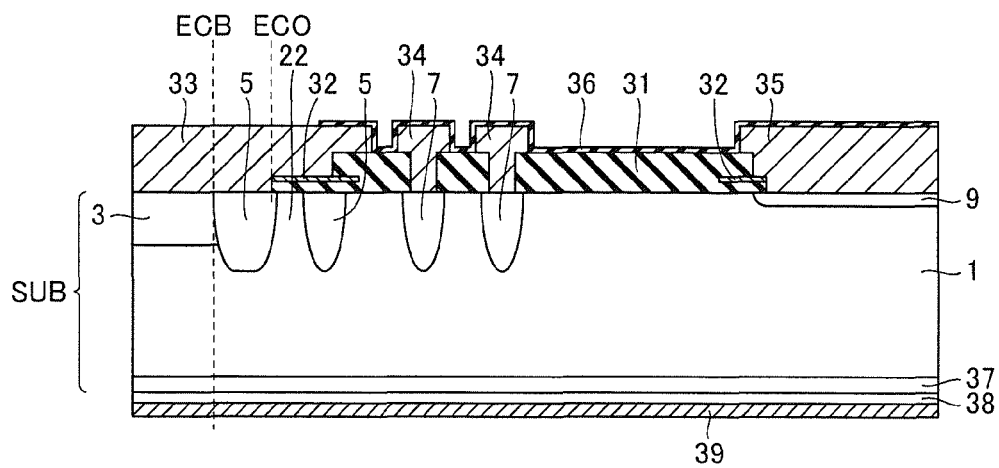
FIG. 14 is a cross section along a cross section line XIV-XIV shown in FIG. 13 in the third embodiment.

Here, a third example of the IGBT will be described. FIG. 13 is a plan view of a semiconductor device according to a third embodiment of the present invention, and FIG. 14 is a cross section along a cross section line XIV-XIV shown in FIG. 13. As shown in FIGS. 13 and 14, in a corner region of p well layer 5, p well layer 5 is partially formed in $n^-$ layer 1, and a portion ($n^-$ layer 22) of $n^-$ layer 1 in which p well layer 5 is not formed is located in the shape of an arc along the curve of the corner. Emitter electrode 33 fails to contact this $n^-$ layer 22 and also fails to contact the portion of p well layer 5 that is located outside this $n^-$ layer 22.

Furthermore, width W1 of $n^-$ layer 22 (the length in the direction substantially orthogonal to the direction of the tangent of the curve of the corner) is designed so that width W1 is larger than twice the width of lateral diffusion of p well layer 5 so as to prevent the portion of p well layer 5 that is located inside $n^-$ layer 22 and the portion of p well layer 5 that is located outside $n^-$ layer 22 from being connected to each other due to thermal diffusion, namely so as to allow the region of $n^-$ layer 22 to be present (left) in the final state. Since features other than the above-described ones are similar to those shown in FIGS. 1 and 2, the same components are denoted by the same reference characters and the description thereof will not be repeated.

An operation of the semiconductor device will now be described. The operation of this semiconductor device is basically identical to the operation of the semiconductor device described in connection with the first embodiment. In an ON operation, a predetermined (positive) voltage equal to or higher than a threshold voltage is applied to an embedded gate electrode (not shown) formed in a region of p base layer 3 to thereby render the MOS channel ON, cause electrons and holes to be injected into $n^-$ layer 1 and accordingly cause conductivity modulation, and cause the voltage between collector electrode 39 and emitter electrode 33 to decrease.

In a turn-off operation, the voltage applied to the embedded gate electrode is set lower than the threshold voltage to thereby render the MOS channel OFF. The MOS channel is thus rendered OFF to stop injection of electrons and holes. After this, the holes stored in $n^-$ layer 1 for example are removed from p base layer 3 to emitter electrode 33. Meanwhile, the electrons are removed to collector electrode 39. At the time when a depletion region that is left after the holes and electrons are removed becomes able to hold the breakdown voltage, the OFF state is reached.

In the above-described semiconductor device having the pattern as shown in FIG. 13, arc-shaped $n^-$ layer 22 is located along the curve of the corner in the corner region of p well layer 5, and this $n^-$ layer 22 is still present in the final state after heat treatment as shown in FIG. 14. Accordingly, the impurity concentration of the p type impurity in the corner region where both p well layer 5 and $n^-$ layer 22 are located is lower than the impurity concentration of the p-type impurity in the region which is other than the corners and in which only p well layer 5 is located. Namely, the effective impurity concentration of the p-type impurity in the corner region of p well layer 5 is lower than the impurity concentration of the p-type impurity in the region other than the corners.

Therefore, in the turn-off operation, hole current flowing into the portion (point G) of p well layer 5 that is located outside $n^-$ layer 22 cannot directly flow through $n^-$ layer 22 into the portion (point H) of p well layer 5 that is located inside $n^-$ layer 22. Accordingly, the flow of the hole current is divided into two flows from the portion (point G) of p well layer 5 along the curve, or a part of the flow of the hole current proceeds from $n^-$ layer 1 to the portion (point H) of p well layer 5. Moreover, since the resistance of the region from the portion (point G) of p well layer 5 to emitter electrode 33 is high due to the presence of $n^-$ layer 22, the amount of current flowing into the portion (point G) of p well layer 5 is relatively smaller. As a result, local impact ionization in the corner is suppressed and breakdown of the semiconductor device can be prevented.

Moreover, $n^-$ layer 22 is formed by partially forming p well layer 5 in $n^-$ layer 1 located in the region where the corner is formed. Accordingly, there is no need to expand the area to be occupied by the semiconductor device and no need to separately form an additional region. Thus, breakdown of the semiconductor device can be prevented without increasing the production cost.

Fourth Embodiment

Figure 15:
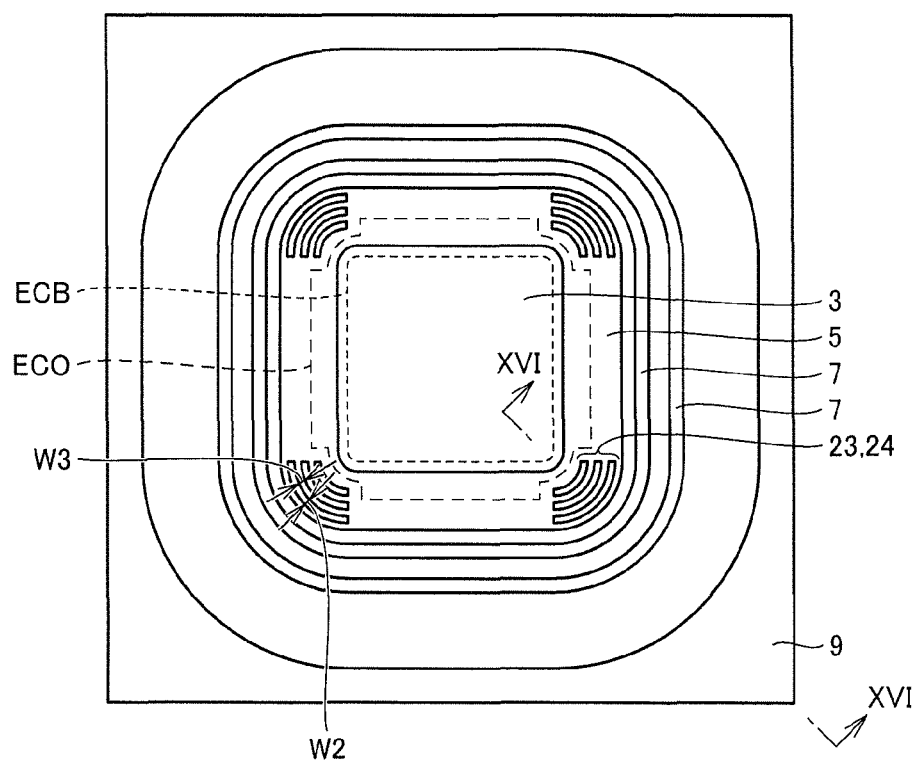
FIG. 15 is a plan view of a semiconductor device according to a fourth embodiment of the present invention.
Figure 16:
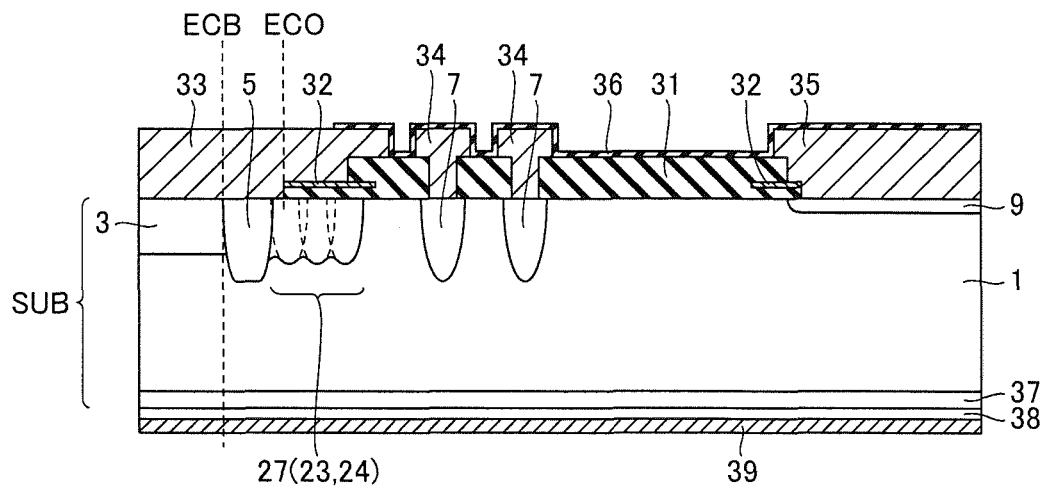
FIG. 16 is a cross section along a cross section line XVI-XVI shown in FIG. 15 in the fourth embodiment.

Here, a fourth example of the IGBT will be described. FIG. 15 is a plan view of a semiconductor device according to a fourth embodiment of the present invention, and FIG. 16 is a cross section along a cross section line XVI-XVI shown in FIG. 15. As shown in FIGS. 15 and 16, in a corner region of p well layer 5, p well layer 5 is partially formed as a comb-shaped p well layer 24 in $n^-$ layer 1, and a comb-shaped portion ($n^-$ layer 23) of $n^-$ layer 1 in which p well layer 24 is not formed is located in the shape of an arc along the curve of the corner. Comb-shaped $n^-$ layer 23 and comb-shaped p well layer 24 each extending along the curve of the corner are arranged by turns in the direction substantially orthogonal to the direction of the tangent of the curve of the corner.

Width W2 of comb-shaped $n^-$ layer 23 is designed so that width W2 is smaller than twice the width of lateral diffusion, caused by heat treatment, of comb-shaped p well layer 24 located inside comb-shaped $n^-$ layer 23 or comb-shaped p well layer 24 located outside thereof, and width W3 of comb-shaped p well layer 24 is designed so that width W3 is smaller than the length corresponding to the depth of p well layer 5. Emitter electrode 33 fails to contact this portion of $n^-$ layer 1 and also fails to contact the portion of p well layer 5 that is located outside the innermost $n^-$ layer 23, except for the portion of p well layer 5 that is located inside innermost comb-shaped $n^-$ layer 23. Since features other than the above-described ones are similar to those shown in FIGS. 1 and 2, the same components are denoted by the same reference characters and the description thereof will not be repeated.

An operation of the semiconductor device will now be described. The operation of this semiconductor device is basically identical to the operation of the semiconductor device described in connection with the first embodiment. In an ON operation, a predetermined (positive) voltage equal to or higher than a threshold voltage is applied to an embedded gate electrode (not shown) formed in a region of p base layer 3 to thereby render the MOS channel ON, cause electrons and holes to be injected into $n^-$ layer 1 and accordingly cause conductivity modulation, and cause the voltage between collector electrode 39 and emitter electrode 33 to decrease.

In a turn-off operation, the voltage applied to the embedded gate electrode is set lower than the threshold voltage to thereby render the MOS channel OFF. The MOS channel is thus rendered OFF to stop injection of electrons and holes. After this, the holes stored in $n^-$ layer 1 for example are removed from p base layer 3 to emitter electrode 33. Meanwhile, the electrons are removed to collector electrode 39. At the time when a depletion region that is left after the holes and electrons are removed becomes able to hold the breakdown voltage, the OFF state is reached.

In the above-described semiconductor device having the pattern as shown in FIG. 15, width W2 of comb-shaped $n^-$ layer 23 is smaller than twice the width of lateral diffusion, due to heat treatment, of comb-shaped p well layer 24 located inside comb-shaped $n^-$ layer 23 or comb-shaped p well layer 24 located outside thereof. Therefore, comb-shaped p well layer 24 located in the corner forms a p-type low-concentration region 27 in which the elements constituting the comb of p well layer 24 are connected to each other in the final state after heat treatment. In the corner, width W3 of comb-shaped p well layer 24 is designed so that it is smaller than the length corresponding to the depth of comb-shaped p well layer 24. Therefore, the p-type impurity included in comb-shaped p well layer 24 effectively diffuses and the impurity concentration of the p-type impurity decreases. Thus, the impurity concentration of the p-type impurity in the corner has less variation and is thus more uniform.

As seen from the above, in the above-described semiconductor device, the effective impurity concentration of the p-type impurity in the corner is low. Therefore, in the corner, the resistance in the direction substantially orthogonal to the direction of the tangent of the curve of the corner is higher. As a result, local impact ionization in the corner is suppressed and breakdown of the semiconductor device can be prevented.

Moreover, in $n^-$ layer 1 located in the region where the corner is formed, p well layer 24 is partially formed in the shape of a comb to thereby form comb-shaped $n^-$ layer 23. The subsequent heat treatment connects the elements constituting the comb shape of p well layer 24 to thereby form p-type low-concentration region 27. Accordingly, there is no need to expand the area to be occupied by the semiconductor device and no need to separately form an additional region. Thus, breakdown of the semiconductor device can be prevented without increasing the production cost.

Fifth Embodiment

Figure 17:
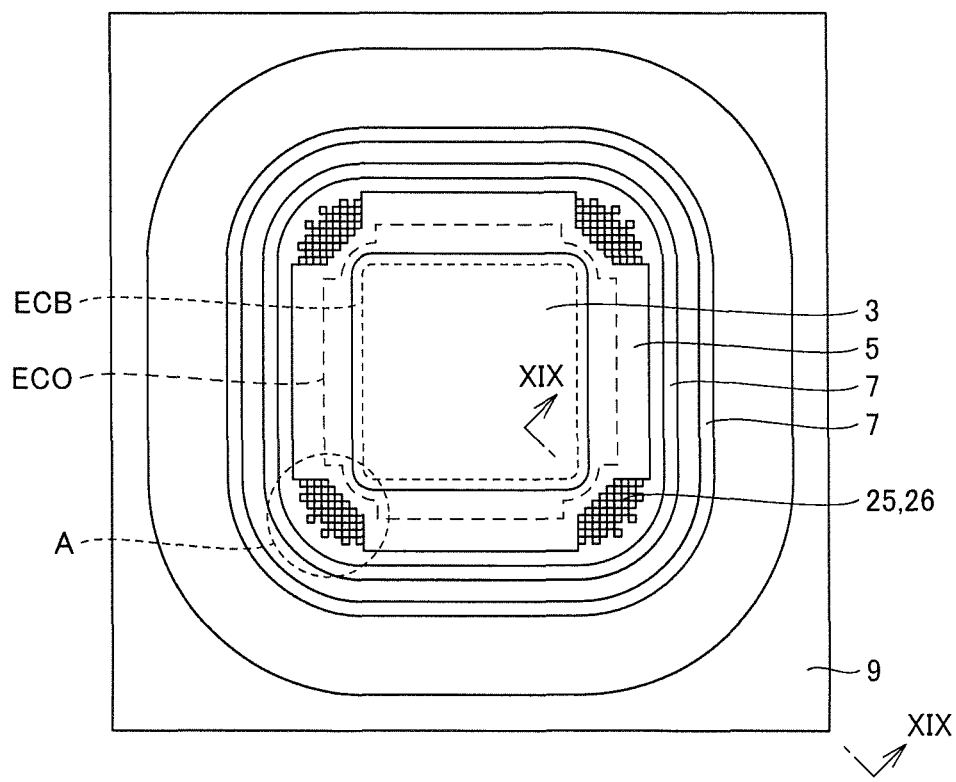
FIG. 17 is a plan view of a semiconductor device according to a fifth embodiment of the present invention.
Figure 18:
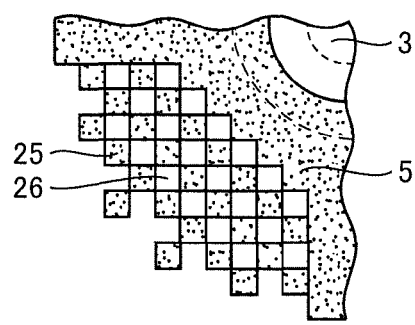
FIG. 18 is a partially enlarged plan view showing, in an enlarged form, the inside of a region A shown in FIG. 17 in the fifth embodiment.
Figure 19:
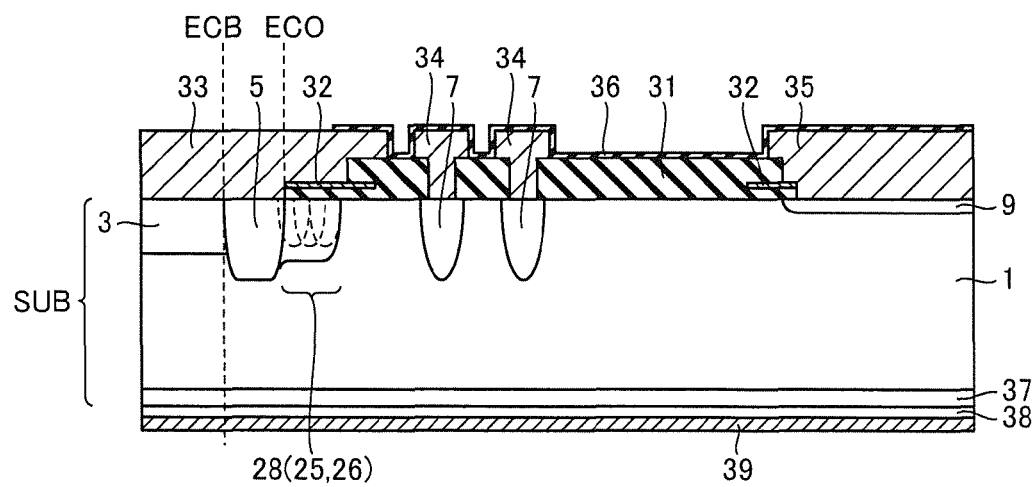
FIG. 19 is a cross section along a cross section line XIX-XIX shown in FIG. 17 in the fifth embodiment.

Here, a fifth example of the IGBT will be described. FIG. 17 is a plan view of a semiconductor device according to a fifth embodiment of the present invention, FIG. 18 is a partially enlarged plan view showing the inside of a region A shown in FIG. 17 in an enlarged form, and FIG. 19 is a cross section along a cross section line XIX-XIX shown in FIG. 17. As shown in FIGS. 17, 18, and 19, in a corner region of p well layer 5, p well layer 5 is partially formed as a p well layer 25 in the form of a lattice in $n^-$ layer 1, and a portion ($n^-$ layer 26) of $n^-$ layer 1 in which p well layer 25 is not formed is located in the form of a lattice. Since features other than the above-described ones are similar to those shown in FIGS. 1 and 2, the same components are denoted by the same reference characters and the description thereof will not be repeated.

An operation of the semiconductor device will now be described. The operation of this semiconductor device is basically identical to the operation of the semiconductor device described in connection with the first embodiment. In an ON operation, a predetermined (positive) voltage equal to or higher than a threshold voltage is applied to an embedded gate electrode (not shown) formed in a region of p base layer 3 to thereby render the MOS channel ON, cause electrons and holes to be injected into $n^-$ layer 1 and accordingly cause conductivity modulation, and cause the voltage between collector electrode 39 and emitter electrode 33 to decrease.

In a turn-off operation, the voltage applied to the embedded gate electrode is set lower than the threshold voltage to thereby render the MOS channel OFF. The MOS channel is thus rendered OFF to stop injection of electrons and holes. After this, the holes stored in $n^-$ layer 1 for example are removed from p base layer 3 to emitter electrode 33. Meanwhile, the electrons are removed to collector electrode 39. At the time when a depletion region that is left after the holes and electrons are removed becomes able to hold the breakdown voltage, the OFF state is reached.

In the above-described semiconductor device, $n^-$ layer 26 and p well layer 25 are formed in the shape of a lattice in a corner region of p well layer 5. Lattice-shaped $n^-$ layer 26 and lattice-shaped p well layer 25 have a pattern formed so that it is narrower than the length corresponding to the depth of p well layer 5. Therefore, in the final state after heat treatment, the elements constituting the lattice of p well layer 25 are connected to each other to form a p-type impurity region 28 having a low impurity concentration of the p-type impurity as shown in FIG. 19. Thus, the impurity concentration of the p-type impurity in the corner has less variation and is made more uniform.

Emitter electrode 33 fails to contact lattice-shaped $n^-$ layer 26 and also fails to contact lattice-shaped p well layer 25 located outside the innermost lattice-shaped $n^-$ layer 26 except for lattice-shaped p well layer 25 located inside innermost lattice-shaped $n^-$ layer 26.

As seen from the above, in the above-described semiconductor device, the effective impurity concentration of the p-type impurity in the corner is low. Therefore, in the corner, the resistance in the direction substantially orthogonal to the direction of the tangent of the curve of the corner is higher. As a result, local impact ionization in the corner is suppressed and breakdown of the semiconductor device can be prevented.

Moreover, in $n^-$ layer 1 located in the region where the corner is formed, p well layer 25 is partially formed in the shape of a lattice to thereby form lattice-shaped $n^-$ layer 26. Accordingly, there is no need to expand the area to be occupied by the semiconductor device and no need to separately form an additional region. Thus, breakdown of the semiconductor device can be prevented without increasing the production cost. While the present embodiment provides a quadrangular lattice shaped pattern by way of example, it may alternatively be a hexagonal or octagonal lattice shaped pattern (not shown).

Sixth Embodiment

Figure 20:
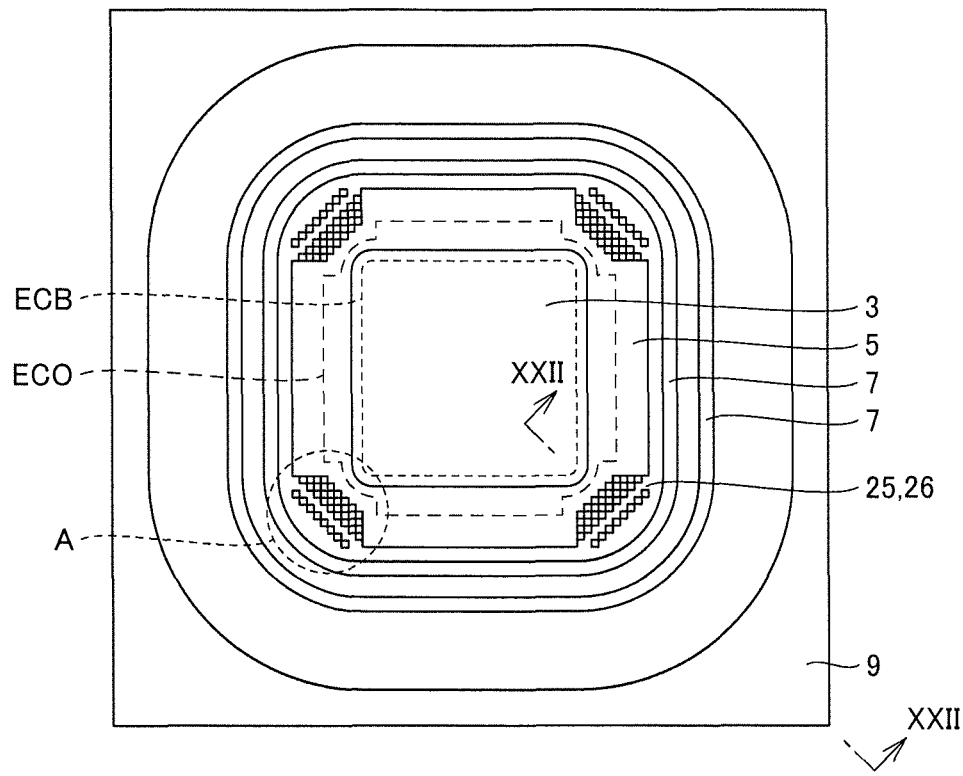
FIG. 20 is a plan view of a semiconductor device according to a sixth embodiment of the present invention.
Figure 21:
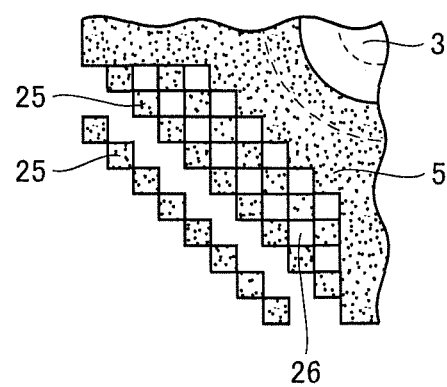
FIG. 21 is a partially enlarged plan view showing, in an enlarged form, the inside of a region A shown in FIG. 20 in the sixth embodiment.
Figure 22:
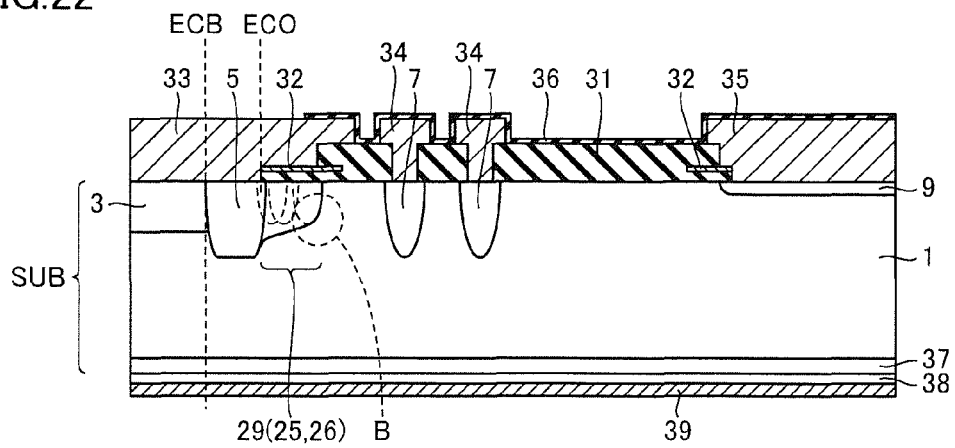
FIG. 22 is a cross section along a cross section line XXII-XXII shown in FIG. 20 in the sixth embodiment.

Here, a sixth example of the IGBT will be described. FIG. 20 is a plan view of a semiconductor device according to a sixth embodiment of the present invention, FIG. 21 is a partially enlarged plan view showing the inside of a region A shown in FIG. 20 in an enlarged form, and FIG. 22 is a cross section along a cross section line XXII-XXII shown in FIG. 20. As shown in FIGS. 20, 21, and 22, in a corner region of p well layer 5, p well layer 5 is partially formed as a p well layer 25 in the shape of a lattice in $n^-$ layer 1, and a portion ($n^-$ layer 26) of $n^-$ layer 1 in which p well layer 25 is not formed is located in the form of a lattice. The intervals between the elements constituting the lattice of p well layer 25 that are located along the direction substantially orthogonal to the direction of the tangent of the curve of the corner are set so that the interval is larger as the distance from the emitter (p base layer 3) is larger. Since features other than the above-described ones are similar to those shown in FIGS. 1 and 2, the same components are denoted by the same reference characters and the description thereof will not be repeated.

An operation of the semiconductor device will now be described. The operation of this semiconductor device is basically identical to the operation of the semiconductor device described in connection with the first embodiment. In an ON operation, a predetermined (positive) voltage equal to or higher than a threshold voltage is applied to an embedded gate electrode (not shown) formed in a region of p base layer 3 to thereby render the MOS channel ON, cause electrons and holes to be injected into n⁻ layer 1 and accordingly cause conductivity modulation, and cause the voltage between collector electrode 39 and emitter electrode 33 to decrease.

In a turn-off operation, the voltage applied to the embedded gate electrode is set lower than the threshold voltage to thereby render the MOS channel OFF. The MOS channel is thus rendered OFF to stop injection of electrons and holes. After this, the holes stored in n⁻ layer 1 for example are removed from p base layer 3 to emitter electrode 33. Meanwhile, the electrons are removed to collector electrode 39. At the time when a depletion region that is left after the holes and electrons are removed becomes able to hold the breakdown voltage, the OFF state is reached.

The above-described semiconductor device differs from the IGBT described in connection of the fifth embodiment in that the intervals between the elements constituting the lattice of p well layer 25 that are located along the direction substantially orthogonal to the direction of the tangent of the curve of the corner are set so that the interval is larger as the distance from the emitter (p base layer 3) is larger. Therefore, in this corner, the width of the region in which the impurity concentration of the p-type impurity changes is wider than the width of the region in which the impurity concentration of the p-type impurity changes in p well layer 5 (the portion other than corners).

Thus, in the corner of the above-described semiconductor device, the impurity concentration of the p type impurity is lower as the location of this impurity concentration is closer to the outside. Therefore, in the corner as shown in FIG. 22, lateral diffusion of the p-type impurity in a p-type low-concentration impurity region 29 exhibits a gradual change and consequently the radius of curvature of the shape as seen in the cross section of the corner (inside the region B) is large. The electric field in the corner can thus be reduced and impact ionization can be suppressed. In addition, even if the resistance in the direction substantially orthogonal to the tangent of the curve of the corner is higher in the corner, local impact ionization in the corner can still be suppressed. The above-described semiconductor device has these two effects and thus breakdown of the semiconductor device can be prevented.

Moreover, in n⁻ layer 1 located in the region where the corner is formed, p well layer 25 is partially formed in the shape of a lattice to thereby form lattice-shaped n⁻ layer 26. Accordingly, there is no need to expand the area to be occupied by the semiconductor device and no need to separately form an additional region. Thus, breakdown of the semiconductor device can be prevented without increasing the production cost.

In the above-described semiconductor device, the corner is provided with a region in which the effective radius of curvature of p well layer 5 is alleviated (the radius of curvature is increased) by adjusting factors such as the interval between the lattice elements constituting the lattice of p well layer 25 and the arrangement of the lattice elements of p well layer 25. In addition, in the semiconductor device described in connection with the fourth embodiment, for example, a corner may be provided with a region in which the radius of curvature is alleviated by adjusting the interval between the elements constituting the comb of p well layer 24. In the above-described semiconductor device, the impurity concentration of the p-type impurity can also be made lower by making relatively smaller the size of the elements constituting the lattice of p well layer 25 of the corner that are located relatively closer to the outside. Furthermore, lattice-shaped p well layer 25 may also be formed along the whole circumference of p well layer 5 surrounding p base layer 4 rather than only the corner region.

Figure 23:
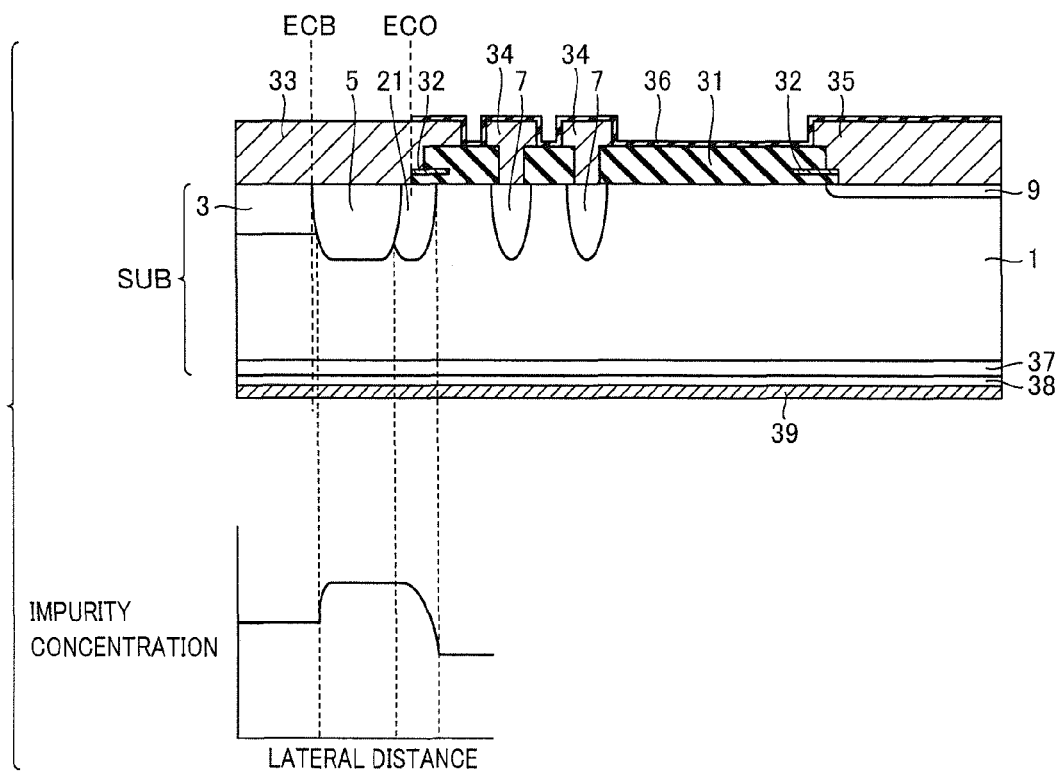
FIG. 23 is a diagram showing a cross-sectional structure and an impurity concentration profile of a semiconductor device according to a modification.
Figure 25:
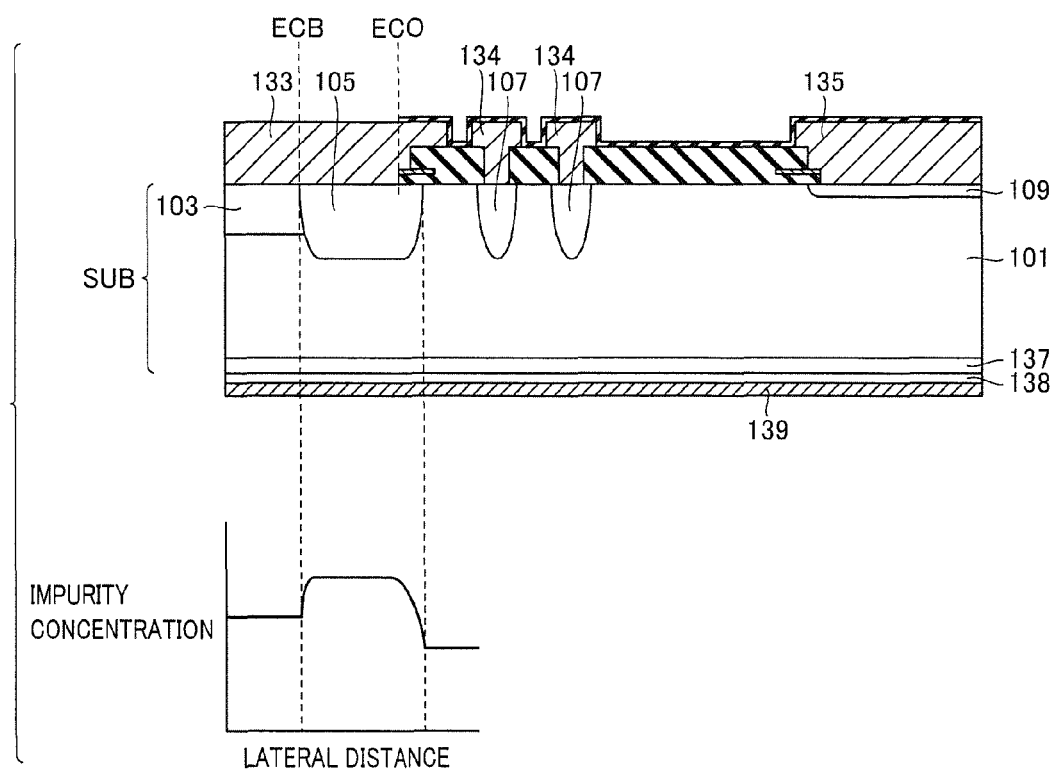
FIG. 25 is a diagram showing a cross-sectional structure and an impurity concentration profile of a semiconductor device according to the first comparative example.

Regarding the profile of the impurity concentration of the p-type impurity in a substrate surface portion made up of a corner of the p well layer 5 and its vicinity, the inclination of the impurity concentration profile of the p-type impurity in p low-concentration layer 21 of the corner region is preferably set gentle as shown in FIG. 23. FIG. 23 shows an example where the structure of the first embodiment is used, and it is seen from FIG. 23 that the impurity concentration profile is gentler than the first comparative example (see FIG. 25). In this case, for example, the electric field in the corner where p low-concentration layer 21 is located is alleviated and local impact ionization in the corner can effectively be suppressed.

Figure 24:
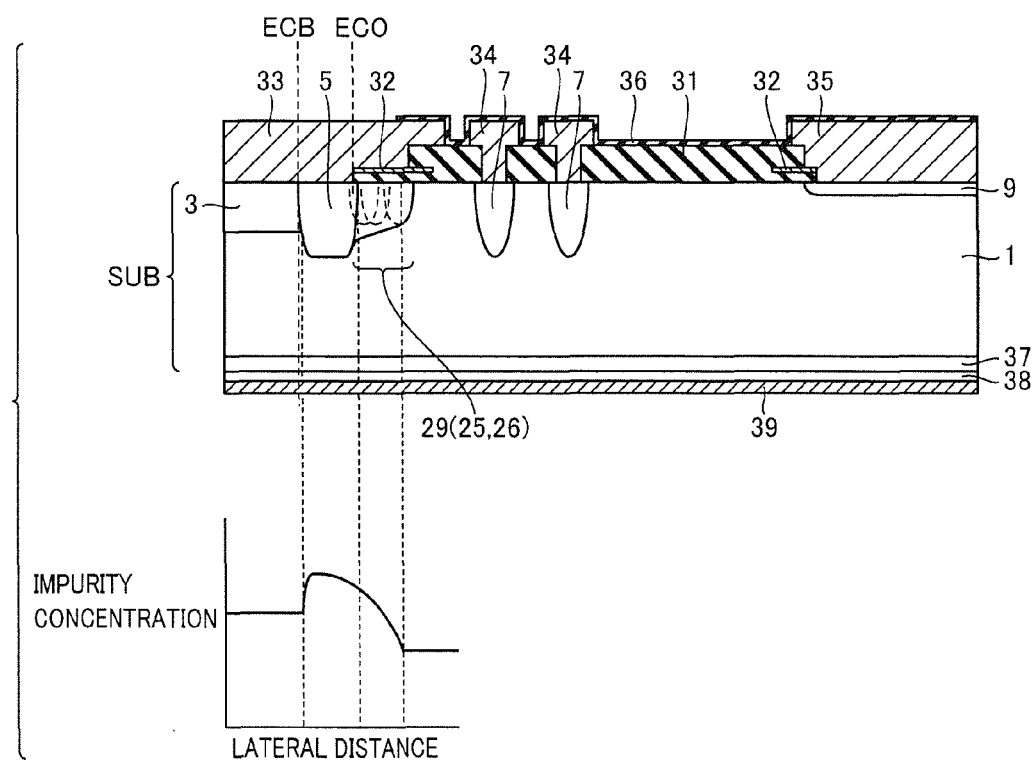
FIG. 24 is a diagram showing a cross-sectional structure and an impurity concentration profile of a semiconductor device according to another modification.

Moreover, in the example where the structure illustrated in connection with the sixth embodiment is used, a similar inclination of the impurity concentration profile of the p-type impurity can be set gentle as shown in FIG. 24, as compared with the impurity concentration profile shown in FIG. 23. In this case, the electric field in the corner where p well layer 25 is located for example is further alleviated to ensure that local impact ionization in the corner can be suppressed.

While the trench-type IGBT has been described as an example of the semiconductor device, the above-described structure of the IGBT is applicable as well to planar IGBT, CSTBT® or the like. It is applicable not only to the IGBT but to a bipolar transistor, diode or the like, for example. The material for the substrate is not particularly limited, and silicon, SiC or the like may be used.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device conducting current between a first electrode formed on a first main surface of a semiconductor substrate and a second electrode formed on a second main surface of the semiconductor substrate, the semiconductor device comprising:

the semiconductor substrate having said first main surface and said second main surface opposite to each other;

a first region of a first conductivity type formed in said first main surface of said semiconductor substrate to extend from said first main surface to a first depth;

a second region of a second conductivity type having a predetermined impurity concentration, having a planar pattern including a corner, and formed from a surface of a predetermined region in said first region to a second depth shallower than said first depth;

a third region of the second conductivity type circumferentially surrounding said second region so that said third region is spaced from said second region, and formed from a surface of said first region to a third depth;

the first electrode formed to be electrically connected to said second region;

the second electrode formed to contact said second main surface of said semiconductor substrate, and said corner of said second region has a low-impurity-concentration region at a distance across the planar pattern from an inner peripheral end of the planar pattern in a direction substantially orthogonal to a direction of the tangent of the curve at the corner towards the outer peripheral end of the planar pattern, said low-impurity-concentration region having an effective impurity concentration that is lower than the predetermined impurity concentration of the second region away from the corner and at a same distance across the planar pattern as measured from the inner peripheral end in a direction substantially perpendicular to the inner peripheral end.

2. The semiconductor device according to claim 1, wherein an insulating film is interposed between said first electrode and said low-impurity-concentration region.

3. The semiconductor device according to claim 1, wherein in said low-impurity-concentration region, said second region is intermittently formed in said first region and a part of said first region of the first conductivity type and a part of said second region of the second conductivity type are located.

4. The semiconductor device according to claim 3, wherein said low-impurity-concentration region includes a portion in which a part of said first region and a part of said second region are formed in an arc shape.

5. The semiconductor device according to claim 3, wherein said low-impurity-concentration region includes a portion in which a part of said first region and a part of said second region are formed in a lattice shape.

6. The semiconductor device according to claim 1, wherein an inclination of an impurity concentration profile of the second conductivity type in a second direction in said low-impurity-concentration region is set gentler than an inclination of an impurity concentration profile of the second conductivity type in a part of said second region that abuts on said corner, where a direction of a tangent of said corner is defined as a first direction and a direction crossing said first direction is defined as said second direction.

7. The semiconductor device according to claim 1, further comprising a fourth region of the second conductivity type formed from said second main surface of said semiconductor substrate to reach said first region, wherein
said second electrode is electrically connected to said fourth region.

* * * * *